United States Patent [19]

Fujita

[11] Patent Number: 4,926,068
[45] Date of Patent: May 15, 1990

[54] VOLTAGE COMPARATOR HAVING HYSTERESIS CHARACTERISTICS

[75] Inventor: Yasuhiko Fujita, Ninomiya, Japan

[73] Assignee: Kabushiki Kaisha Toshiba, Kawasaki, Japan

[21] Appl. No.: 288,822

[22] Filed: Dec. 23, 1988

[30] Foreign Application Priority Data

Dec. 26, 1987 [JP] Japan .................... 62-330493

[51] Int. Cl.⁵ ................... H03K 5/24; H03K 3/15
[52] U.S. Cl. ........................ 307/359; 307/290; 328/150
[58] Field of Search ............ 307/350, 359, 290; 328/150

[56] References Cited

U.S. PATENT DOCUMENTS

| | | | |
|---|---|---|---|
| 4,384,219 | 5/1983 | Davis | 307/359 |
| 4,556,805 | 12/1985 | Shoji | 307/359 |
| 4,581,545 | 4/1986 | Beale et al. | 307/359 |
| 4,634,897 | 1/1987 | Yoshioka | 307/359 |

FOREIGN PATENT DOCUMENTS

| | | | |
|---|---|---|---|
| 0010917 | 1/1987 | Japan | 307/359 |
| 0021319 | 1/1987 | Japan | 307/359 |

OTHER PUBLICATIONS

H. Kadota, "Operational Circuit and its Analysis by Experiments", Tokyo Denko University, Publishing Bureau (pp. 32–33).

*Primary Examiner*—John Zazworsky
*Attorney, Agent, or Firm*—Finnegan, Henderson, Farabow, Garrett and Dunner

[57] ABSTRACT

A voltage comparator circuit with hysteresis characteristics includes a voltage comparator circuit for comparing an input signal voltage with a comparison reference voltage and outputting a comparison result, a resistor element connected between the reference potential terminal and the comparison reference voltage input terminal of the voltage comparator circuit, a first constant current source for supplying current into the comparison reference voltage terminal and a second constant current source for deriving current out of the comparison reference voltage input terminal, and a control circuit for selectively activating one of the first and second current sources, in accordance with the logic level of an output of the voltage comparator circuit.

26 Claims, 6 Drawing Sheets

VOLTAGE COMPARATOR HAVING HYSTERESIS CHARACTERISTICS

BACKGROUND OF THE INVENTION

1. Field of the Invention

This invention relates to a voltage comparator circuit for detecting the amplitude of an input signal or the like, and more particularly to a voltage comparator circuit whose input/output characteristics have hysteresis characteristics.

2. Description of the Related Art

Figure 5:
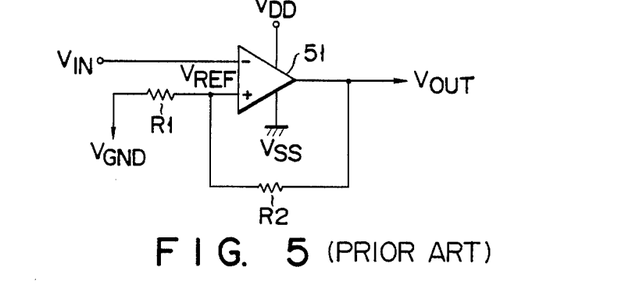
FIG. 5 shows a conventional voltage comparator circuit having hysteresis characteristics.

A voltage comparator circuit having hysteresis characteristics is used to detect the amplitude of an input signal to prevent an erroneous operation due to noise included in the input signal. For example, it is disclosed in pp 32–33 of the article "Operation Amplifier and the Analysis thereof by Experiment", written by Hideo Tsunoda, Tokyo Denki University Publishing Department. FIG. 5 shows an example of the conventional voltage comparator circuit having hysteresis characteristics. In the circuit of FIG. 5, input voltage $V_{IN}$ is applied to inverting input terminal (−) of operation amplifier 51, positive feedback resistor R2 is connected between the output terminal and non-inverting input terminal (+), and resistor R1 is connected between the non-inverting input terminal and reference potential terminal $V_{GND}$. In the above conventional voltage comparator circuit, comparison reference voltage $V_{REF}$ at the non-inverting input terminal (+) can be expressed as $$V_{REF} = V_{GND} + \frac{R1}{R1+R2}(V_{OUT} - V_{GND}) \quad (1)$$

where Vout is an output voltage.

Assume now that the high potential side power source voltage of operation amplifier 51 is $V_{DD}$ and the lower potential side power source voltage is Vss. In this case, reference potential $V_{REF}^+$ set when output voltage Vout is at a high level ($V_{DD}$ potential) which is given by equation:

$$V_{REF+} = V_{GND} + \frac{R1}{R1+R2}(V_{DD} - V_{GND}) \quad (2)$$

and reference potential $V_{REF}^-$, set when output voltage Vout is at a low level (Vss potential), is given by equation:

$$V_{REF-} = V_{GND} + \frac{R1}{R1+R2}(V_{SS} - V_{GND}) \quad (3)$$

Figure 6:
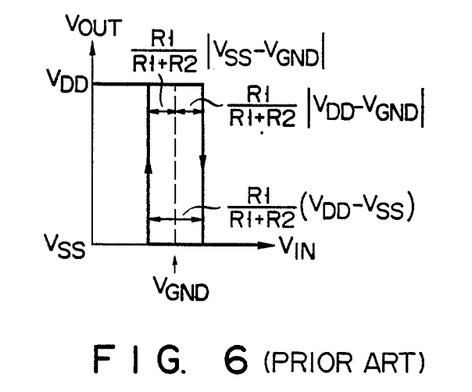
FIG. 6 shows an example of the input-output characteristics of the voltage comparator circuit shown in FIG. 5.

In this way, the above voltage comparator circuit compares input voltage $V_{IN}$ with high reference potential $V_{REF}^+$ at the time of the rising thereof, and with low reference potential $V_{REF}^-$ at the time of fall. Therefore, as shown in FIG. 6, the input/output characteristics thereof will have hysteresis characteristics. In this case, the hysteresis width ($V_{REF}^+ - V_{REF}^-$) is given as $$V_{REF+} - V_{REF-} = \frac{R1}{R1+R2}(V_{DD} - V_{SS}) \quad (4)$$

In the above voltage comparator circuit, ($V_{DD}$−Vss) in equation (4) will vary according to variations in power source voltages $V_{DD}$ and Vss, and, as a result, the hysteresis width will vary depending on the power source voltage. Therefore, when the above voltage comparator circuit is applied to an input signal amplitude detection circuit, the detected level will vary depending on the power source voltage. As a result, it is impossible to use the voltage comparator circuit when it is required to detect the amplitude with high precision.

Further, as can be seen from equation (4), the hysteresis width also depends on (R1/R1+R2). Therefore, it is necessary to set the resistance ratio of (R1+R2) to R1 large when the hysteresis width requires to be set small. However, in an integrated circuit, it is difficult to form resistors R1 to R2 so as to attain a large ratio in area of resistor R2 to resistor R1.

When the hysteresis characteristics are determined in order that the hysteresis width components measured from potential $V_{GND}$ in the higher and lower potential directions are equal to each other (i.e., the hysteresis curve is symmetrical with respect to potential $V_{GND}$), potential $V_{GND}$ then cannot be set to a value other than ($V_{DD}$−Vss)/2. Consequently, in this case, potential $V_{GND}$ is restricted to a certain value and the degree of freedom with regard to setting potential $V_{GND}$ therefore nullified.

To summarize, in the conventional voltage comparator circuit, the hysteresis width has dependency on the power source voltage, and is difficult to set to a small value. In addition, the range in which potential $V_{DD}$ can be set is restricted when the hysteresis width is set to be symmetric with respect to reference potential $V_{GND}$.

SUMMARY OF THE INVENTION

An object of this invention is to provide a voltage comparator circuit with hysteresis characteristics, in which the hysteresis width has no power source voltage dependency, the hysteresis width can be easily set to a small value, and the hysteresis width can be optionally set to be symmetric or asymmetric with respect to a desired reference potential.

According to this invention, there is provided a voltage comparator circuit with hysteresis characteristics, comprising a voltage comparator circuit for comparing an input signal voltage with a comparison reference voltage and outputting a comparison result; a resistor connected between the reference potential terminal and the comparison reference voltage input terminal of the voltage comparator circuit; a first constant current source for supplying current into the comparison reference voltage terminal and a second constant current source for feeding a current from the comparison reference voltage input terminal; and a control circuit for selectively activating one of the first and second current sources according to the logic level of an output of the voltage comparator circuit.

In this invention, when the first current source is activated, the current therefrom is supplied to the resistor to cause a first voltage drop thereacross, thus setting the comparison reference voltage to "reference potential + first voltage drop". In contrast, when the second current source is activated, the current thereof is supplied from the reference potential terminal, via the resistor, to cause a second voltage drop thereacross, thus setting the comparison reference voltage to "reference potential - second voltage drop". As a result, the input/output characteristics will have the hysteresis characteristics, and the hysteresis width is determined by "first voltage drop+second voltage drop". Thus, the hysteresis width is determined by the resistor and the currents of the first and second current sources, and therefore it will have no power source voltage dependency, it can be set to a small value, and it can be set symmetrically or asymmetrically with respect to a desired reference potential.

DETAILED DESCRIPTION OF THE PREFERRED EMBODIMENTS

There will now be described an embodiment of this invention with reference to the accompanying drawings.

Figure 1:
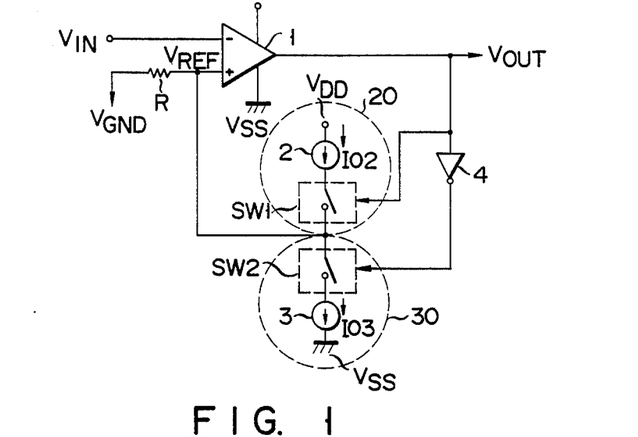
FIG. 1 is a circuit diagram of a voltage comparator circuit having hysteresis characteristics according to one embodiment of this invention.

FIG. 1 shows a voltage comparator circuit with hysteresis characteristics formed in an integrated circuit form. In FIG. 1, 1 denotes an operation amplifier for the voltage comparator circuit. Voltage $V_{DD}$ on the higher potential side power source node and voltage Vss on the lower potential side power source node are applied as the operation voltage of operation amplifier 1. A comparison reference voltage is applied to the non-inverting input terminal (+) of operation amplifier 1, and input signal voltage $V_{IN}$ to be compared with the comparison reference voltage is applied to the inverting input terminal (−). Further, a resistor R is connected between the non-inverting input terminal (+) and reference potential terminal $V_{GND}$.

First constant current source 2 for supplying constant current Io2 to resistor R is serially connected with first switching circuit SW1 to form first current supply circuit 20. Circuit 20 is placed between the $V_{DD}$ voltage node and the non-inverting input terminal (+). Second constant current source 3 for deriving (or feeding) constant current Io3 from reference potential terminal $V_{GND}$, via resistor R, is serially connected with second switching circuit SW2 to form second current supply circuit 30. Circuit 30 is placed between the Vss voltage node and the non-inverting input terminal (+).

In FIG. 1, numeral 4 denotes an inverter circuit which is used to selectively activate one of constant current sources 2 and 3 according to the logic level of output voltage Vout of voltage comparator circuit 1. In this example, the selecting operation is effected by respectively setting switching circuits SW1 and SW2 to the ON and OFF states or to the OFF and ON states.

Figure 2:
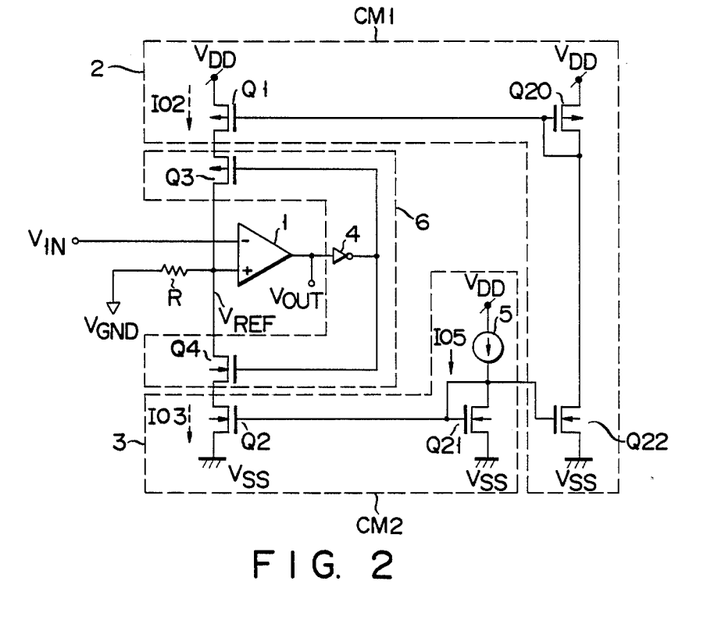
FIG. 2 shows an example of the detailed construction of the voltage comparator circuit shown in FIG. 1.

FIG. 2 shows the detailed construction of the circuit of FIG. 1. First constant current source 2 is constituted by first current mirror circuit CM1 which includes first MOS transistor Q1 of P-channel type connected between the $V_{DD}$ voltage node and non-inverting input terminal (+) on the output side and P-channel MOS transistor Q20 whose gate and drain are connected together on the input side.

Second constant current source 3 is constituted by second current mirror circuit CM2 which includes second MOS transistor Q2 of N-channel type connected between the Vss voltage node and non-inverting input terminal (+) on the output side and N-channel MOS transistor Q21 whose gate and drain are connected together on the input side.

In second current mirror circuit CM2, constant current (Io5) source 5 is serially connected to input side transistor Q21. N-channel MOS transistor Q22 which is connected to input side transistor Q21 in a current mirror fashion is serially connected to input side transistor Q20 of first current mirror circuit CM1. In this way, first and second current mirror circuits CM1 and CM2 are connected to each other in a current mirror fashion.

First switching circuit SW1 is formed of third MOS transistor Q3 of P-channel type connected between first MOS transistor Q1 and the non-inverting input terminal (+). Second switching circuit SW2 is formed of fourth MOS transistor Q4 of N-channel type connected between second MOS transistor Q2 and the non-inverting input terminal (+). The gates of switching MOS transistors Q3 and Q4 are connected to receive an output of inverter circuit 4. Switching MOS transistors Q3 and Q4 and inverter circuit 4 are combined to form control circuit 6.

Figure 3:
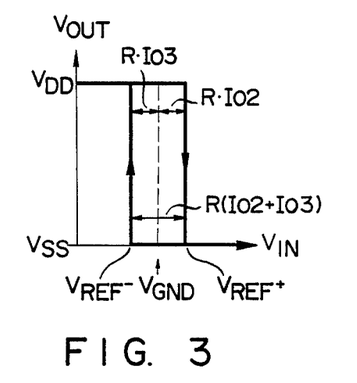
FIG. 3 shows an example of the input-output characteristics of the voltage comparator circuit shown in FIG. 1.

There will now be described the operation of the above voltage comparator circuit with reference to the input/output characteristics shown in FIG. 3.

When output voltage $V_{OUT}$ is at a high level, an output of inverter circuit 4 is set to a low level. As a result, first switching circuit SW1 is turned on to activate first constant current source 2 and second switching circuit SW2 is turned off to set second constant current source 3 into the non-active state. At this time, constant current Io2 from first constant current source 2 flows into resistor R, and comparison reference voltage $V_{REF}^+$ applied to the non-inverting input terminal (+) at this time can be expressed as follows:

$$V_{REF}^+ = V_{GND} + R \cdot Io2 \qquad (5)$$

When output voltage Vout is at a low level, an output of inverter circuit 4 is set to a high level. As a result, second switching circuit SW2 is turned on to activate second constant current source 3 and first switching circuit SW1 is turned off to set first constant current source 2 into the non-active state. At this time, constant current Io3 is derived out from reference potential terminal $V_{GND}$ into second constant current source 3 via resistor R, and comparison reference voltage $V_{REF}^-$ applied to the non-inverting input terminal (+) at this time can be expressed as follows.

$$V_{REF}^- = VRND - R \cdot Io3 \qquad (6)$$

Therefore, the above voltage comparator circuit compares input voltage $V_{IN}$ with high reference voltage $V_{REF}^+$ when it rises while output voltage Vout is kept at the high level, and compares input voltage $V_{IN}$ with low reference voltage $V_{REF}^-$ when it falls while output voltage Vout is kept at the low level. Thus, the input/output characteristics thereof will have the hysteresis characteristics as shown in FIG. 3.

In this case, the hysteresis width ($V_{REF}^+ - V_{REF}^-$) can be determined by resistor R and currents Io2 and Io3 of the constant current sources as expressed by the following equation:

$$V_{REF}^+ - V_{REF}^- = R(Io2 + Io3) \qquad (7A)$$

In this way, the hysteresis width will not depend on the power source voltage, and it is possible to readily set a small hysteresis width. Further, when both Io2 and Io3 have the same value Io, it is possible to obtain a symmetrical hysteresis width with respect to optional reference potential $V_{GND}$, i.e., $V_{GND}$ IR·Io. In this case, equation (7A) can be modified as follows:

$$V_{REF}^+ - V_{REF}^- = 2R \cdot Io \qquad (7B)$$

Assume that the ratio of areas of the transistors used in current mirror circuits CM1 and CM2 is changed, so that the constant currents of first and second constant current sources 2 and 3 may be respectively set to Io2 and Io3 (=Io2). Then, the hysteresis width becomes (R·Io2+R·Io3)=R(Io2+Io3), and it becomes possible to set an asymmetrical hysteresis width (+RIo2, −RIo3) with respect to reference potential $V_{GND}$.

Figure 4:
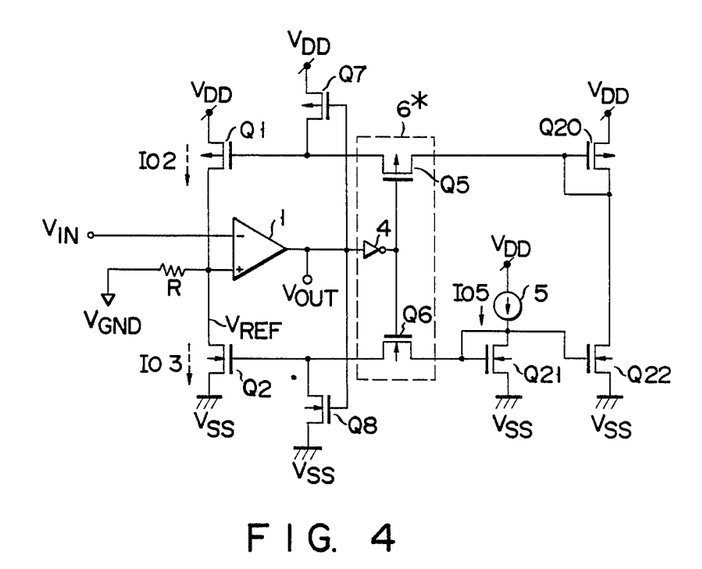
FIG. 4 shows a voltage comparator circuit according to another embodiment of this invention.

FIG. 4 shows a detailed circuit construction of another embodiment of this invention. In the FIG. 4 circuit, third MOS transistor Q3 and fourth MOS transistor Q4 in the FIG. 2 circuit are omitted. Further, fifth MOS transistor Q5 of P-channel type for switching is connected between the gates of MOS transistors Q1 and Q20 which are connected in a current mirror fashion in first current mirror circuit CM1. Likewise, sixth MOS transistor Q6 of N-channel type for switching is connected between the gates of MOS transistors Q2 and Q21 which are connected in a current mirror fashion in second current mirror circuit CM2. The gates of switching MOS transistors Q5 and Q6 are connected to receive an output of inverter circuit 4. Switching MOS transistors Q5 and Q6 and inverter circuit 4 are combined to form control circuit 6*.

Further, P-channel MOS transistor Q7 is connected between the $V_{DD}$ voltage node and the gate of first MOS transistor Q1 forming the constant current source. N-channel MOS transistor Q8 is connected between the gate of second MOS transistor Q2 forming the constant current source and the Vss voltage node. The gates of MOS transistors Q7 and Q8 are connected to receive output voltage Vout of voltage comparator circuit 1.

Other portions are the same as those in the FIG. 2 circuit, and they are denoted by the same reference numerals and the explanation therefor is omitted.

The operation of the voltage comparator circuit in FIG. 4 is basically the same as that of the voltage comparator circuit shown in FIGS. 1 and 2, but the operation of control circuit 6* is slightly different from that of control circuit 6.

That is, when output voltage Vout is at a high level, fifth and sixth switching transistors Q5 and Q6 are respectively turned on and off in response to an output (low level) of inverter circuit 4 to set first and second transistors Q1 and Q2 of the constant current sources into active and non-active states, respectively. At this time, since N-channel MOS transistors Q8 is kept on by high level output voltage Vout, the gate potential of second transistor Q2 is kept at the Vss potential level and thus the gate thereof will not be set into the electrically floating condition.

Further, when output voltage Vout is at a low level, fifth and sixth switching transistors Q5 and Q6 are respectively turned off and on in response to an output (high level) of inverter circuit 4. As a result, first and second transistors Q1 and Q2 of the constant current sources are set into non-active and active states, respectively. At this time, since P-channel MOS transistor Q7 is set on by low level output voltage Vout, the gate potential of first transistor Q1 is kept at the $V_{DD}$ potential level and thus the gate thereof will not be set into the electrically floating condition.

As described above, according to the voltage comparator circuit of this invention, the hysteresis width has no power source voltage dependency, can be set to a small value and can be set symmetrically or asymmetrically with respect to a desired reference potential.

Equation (7A) indicates that the hysteresis width ($V_{REF}^+ - V_{REF}^-$) which is independent of the power source potential ($V_{DD}$, $V_{SS}$) can be obtained even if Io2 or Io3 is zero. Therefore, when the threshold level of the comparator circuit of FIG. 1 is asymmetrical with respect to potential $V_{GND}$ in FIG. 3, one of constant current circuits 20 and 30 of FIG. 1 can be omitted.

Figure 7A:
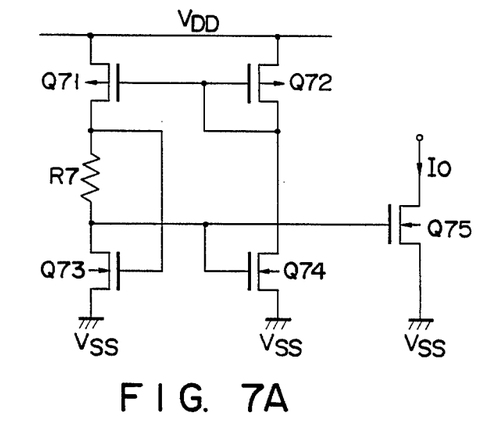
FIGS. 7A and 7B show examples of constant current source circuits (2, 3, 5) used in the embodiment of this invention.
Figure 7B:
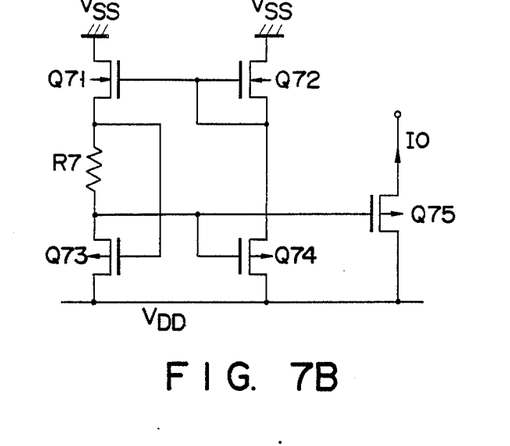

FIGS. 7A and 7B each show an example of the constant current circuit (2, 3, or the like) used in the embodiment of FIG. 1 and other embodiments.

In FIG. 7A, the sources of P-channel MOS transistors Q71 and Q72 are connected to positive power source $V_{DD}$. The gates of transistors Q71 and Q72 are connected to the drain of transistor Q72. The drain of transistor Q71 is connected to the drain of N-channel MOS transistor Q73 via resistor R7, and at the same time to the gate of transistor Q73. Further, the source of transistor Q73 is connected to negative power source $V_{SS}$.

The gate of N-channel MOS transistor Q74 is connected to the drain of transistor Q73 and the source thereof is connected to negative power source $V_{SS}$. The drain of transistor Q74 is connected to the drain of transistor Q72. The drain of transistor Q73 is connected to the gate of N-channel MOS transistor Q75. The source of N-channel MOS transistor Q75 is connected to negative power source $V_{SS}$. The drain of transistor Q75 absorbs constant current Io from an external circuit.

The circuit of FIG. 7A is constructed to absorb constant current Io (Io3), and can be used for current source 3 of FIG. 1 as it is. In a case where the constant current source (2 in FIG. 1, 5 in FIG. 2, and 100, 101 in FIG. 10) for supplying constant current Io (Io2) is constructed, $V_{DD}$ and $V_{SS}$ of FIG. 7A are replaced by $V_{SS}$ and $V_{DD}$, respectively, and the P-channel and N-channel types of transistors Q71 to Q75 are respectively changed to N- and P-channel types as shown in FIG. 7B.

Assume that the ratios of channel width/channel length of P-channel transistors Q71, Q72 are SP1 and SP2, and the ratios of channel width/channel length of N-channel transistors Q73, Q74 are SN1 and SN2. In this case, constant current Io is obtained as follows:

$$Io=(1/K \cdot R7)ln[(SP1/SP2) \cdot (SN2/SN1)]\alpha 1/R7 \qquad (8)$$

When equation (8) is substituted into equation (7B), the following equation is obtained:

$$V_{REF}^+ - V_{REF}^- = 2R \cdot Io = 2(R/K \cdot R7) \times ln[(SP1/SP2) \cdot (SN2/SN1)]\alpha R/R7 \qquad (9)$$

Equation (9) indicates that the hysteresis width ($V_{REF}^+ - V_{REF}^-$) of the comparator circuit of FIG. 1 can be determined by only the resistance ratio.

The resistance ratio can be precisely set in a single IC chip, and the dependency of the resistance ratio on temperature can be suppressed to a minimum. Assume that the circuits of FIGS. 7B and 7A are respectively used as first and second constant current sources 2 and 3, and the first and second constant current sources are integrated with the voltage comparator circuit of FIG. 1 on the same chip. Then, it is possible to attain the hysteresis width ($V_{REF}^+ - V_{REF}^-$) of which the dependency on temperature is suppressed to a minimum and the variation degree for different comparator circuits can be suppressed to an extremely narrow range.

Figure 8A:
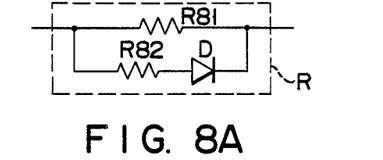
FIGS. 8A to 8C show resistance circuits (R) which are used to provide comparison reference potential $V_{REF}$ and are formed of non-linear resistance circuits.
Figure 8B:
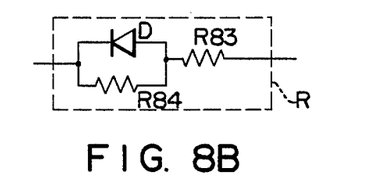
Figure 8C:
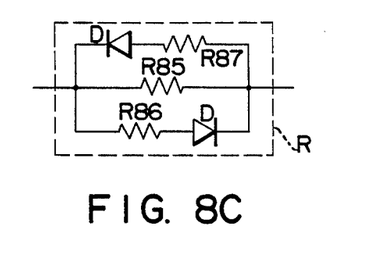

FIGS. 8A to 8C show resistor circuits (R) constituted by nonlinear resistance circuits for supplying comparison reference voltage VREF. The nonlinear resistance circuit has a function of changing resistance R in equation (7A) or (7B) according to the direction of current.

FIG. 8A shows the case wherein resistance R becomes small R=R81 // (R82+Rd) when the current flows from the left to the right in the drawing and becomes large (R=R81) when the current flows from the right to the left in the drawing (Rd is a conduction resistance of diode D). In this way, when the resistance circuit whose resistance R is changed by the direction of the current flow, the hysteresis width ($V_{REF}^+ - V_{REF}^-$) can also be adjusted by the resistance circuit.

FIG. 8B shows the case wherein resistance R becomes large (R=R83+R84) when the current flows from the left to the right in the drawing and becomes small (R=R83+Rd) when the current flows from the right to the left in the drawing. In this case, the hysteresis width ($V_{REF}^+ - V_{REF}^-$) can be adjusted.

FIG. 8C shows the case wherein resistance R is set to a first resistance value (R=R85//(R86+Rd)) when the current flows from the left to the right in the drawing and set to a second resistance value (R=R85//(R87+Rd)) when the current flows from the right to the left in the drawing. In this case, if R86≠R87, the hysteresis width ($V_{REF}^+ - V_{REF}^-$) can be adjusted by resistances R86 and R87.

Figure 9:
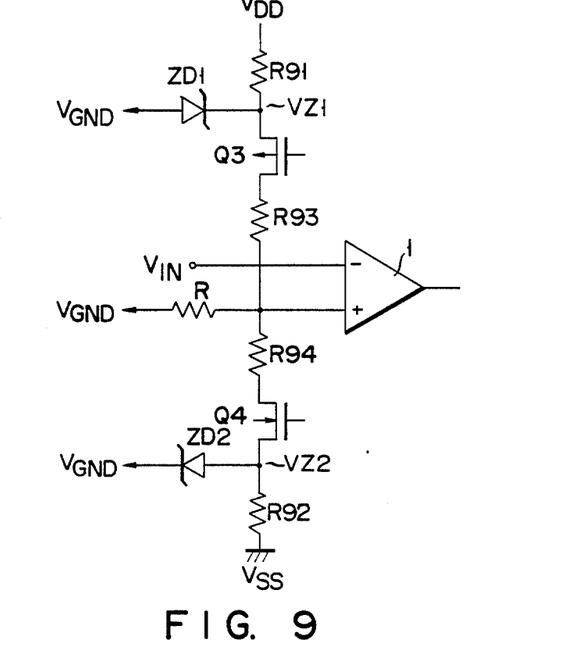
FIG. 9 shows a modification of the current supplying circuit (20, 30) of FIG. 1 which is constructed by using constant voltage sources (ZD1, ZD2) instead of using constant current sources (2, 3)

FIG. 9 shows a circuit which is used as current supplying circuit 20 or 30 of FIG. 1 and is constituted by constant voltage sources (ZD1, ZD2) instead of constant current sources 2 and 3. In this case, the conduction states of transistors Q3 and Q4 are controlled by a signal obtained by inverting an output of operation amplifier 1 by inverter 4 as in the case of transistors Q3 and Q4 of FIG. 2.

In FIG. 9, positive power source $V_{DD}$ is connected to the cathode of zener diode ZD1, via resistor R91. The anode of zener diode ZD1 is connected to a reference potential $V_{GND}$ circuit. When the potential of the reference potential $V_{GND}$ circuit is used as a reference, stable voltage VZ1 which is not influenced by voltage variation of positive power source $V_{DD}$ can be obtained at the cathode of zener diode ZD1. Stabilized voltage VZ1 is supplied to the non-inverting input terminal of operation amplifier 1, via P-channel transistor switch Q3 and resistor R93.

Negative power source $V_{SS}$ is connected to the anode of zener diode ZD2 via resistor R92. The cathode of zener diode ZD2 is connected to the reference potential $V_{GND}$ circuit. When the potential of the reference potential $V_{GND}$ circuit is used as a reference, stable voltage VZ2 which is not influenced by voltage variation of negative power source $V_{SS}$ can be obtained at the anode of zener diode ZD2. Stabilized voltage VZ2 is supplied to the non-inverting input terminal of operation amplifier 1, via N-channel transistor switch Q4 and resistor R94.

In the circuit of FIG. 9, the hysteresis width ($V_{REF}^+ - V_{REF}^-$) can be freely set by means of stabilized voltages VZ1 and VZ2, and resistances R93 and R94.

Figure 10:
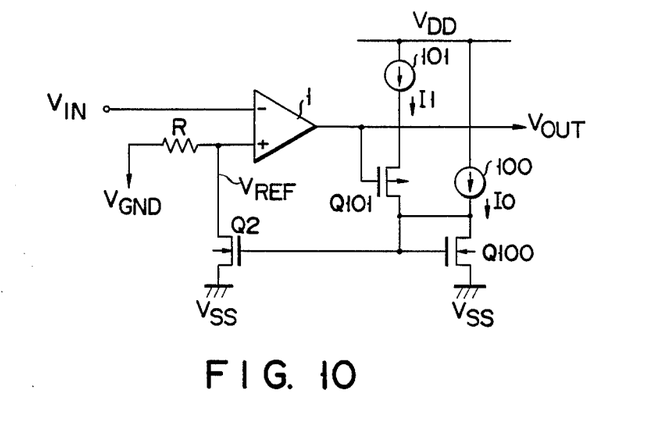
FIG. 10 is a circuit diagram of a comparator circuit according to another embodiment of this invention, for changing a comparison level with hysteresis according to the rise and fall of the input potential.

FIG. 10 shows the circuit construction of another embodiment of this invention in which the hysteresis of a comparison level is set according to the rise and fall of the input potential.

The output of operation amplifier 1 is supplied to the gate of P-channel transistor Q101. The source of transistor Q101 is connected to constant current source 101 of current I1 and the drain thereof is connected to the gates of N-channel transistors Q2 and Q100. The sources of transistors Q2 and Q100 are connected to negative power source $V_{SS}$. The gate and drain of transistor Q100 are both connected to constant current source 100 of current Io. The drain of transistor Q2 is connected to the non-inverting input terminal of operation amplifier 1.

Figure 11:
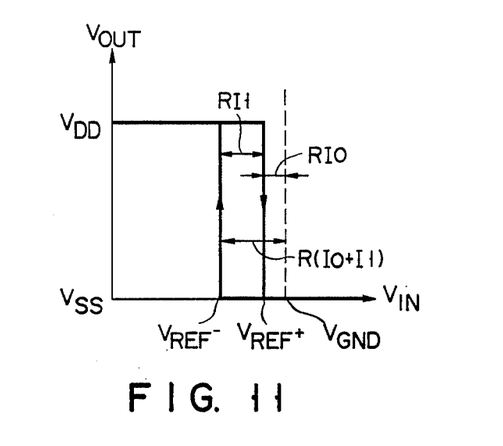
FIG. 11 shows the input-output characteristics of the comparator circuit shown in FIG. 10.

The input-output characteristics of the circuit of FIG. 10 may be shown in FIG. 11, and comparison level $V_{REF}$ varies according to the rise and fall of input signal $V_{IN}$. That is, the level variation point of output $V_{OUT}$ at the time of rise of input signal potential $V_{IN}$ is expressed by $V_{REF}^+ = V_{GND} - R \cdot Io$, and the level variation point of output VOUT at the time of fall of input signal potential $V_{IN}$ is expressed by $V_{REF}^- = V_{GND} - R(Io+I1)$.

In this way, the hysteresis can be set so that the comparison level can be changed according to the rise and fall of the input potential. In this case, the hysteresis width is R·I1, and can be set free from variation in the power source voltage ($V_{DD}$, $V_{SS}$) if I1 is stabilized.

Figure 12:
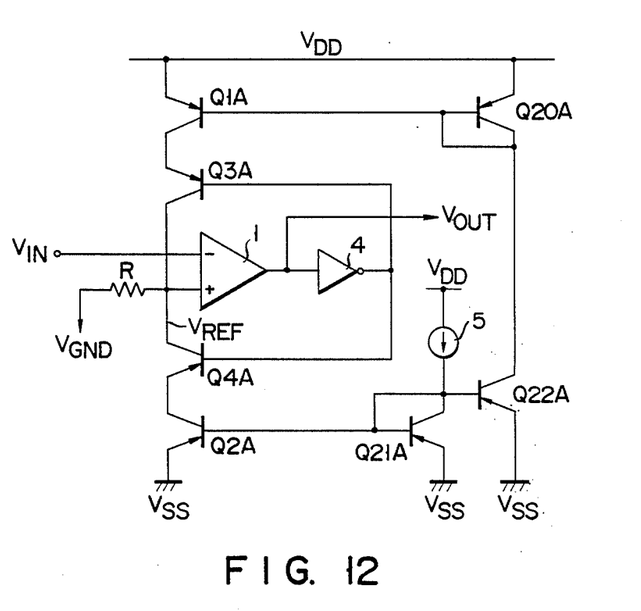
FIG. 12 shows another example of the construction of the voltage comparator circuit shown in FIG. 1.

FIG. 12 shows the circuit of FIG. 2 which is constructed by bipolar transistor instead of MOS transistors. In FIG. 12, transistors Q1A to Q4A correspond to transistors Q1 to Q4 of FIG. 2, respectively. Further, transistors Q20A to Q22A in FIG. 12 respectively correspond to transistors Q20 to Q22 of FIG. 2. The operation of the circuit of FIG. 12 is basically the same as that of the circuit of FIG. 2.

What is claimed is:

1. A comparator circuit comprising:
   level comparator means, coupled to a power source voltage and responsive to an input signal having a first input level higher than a predetermined first comparison level and to a second input level lower than a predetermined second comparison level, for generating an output signal which varies with level variation of the input signal between the first and second input levels, the output signal being varied from a first output level to a second output level when the level of the input signal is changed across the first comparison level, and being varied from the second output level to the first output level when the level of the input signal is changed across the second comparison level;

resistance circuit means, connected to said level comparator means, for providing a voltage drop corresponding to the first and second comparison levels; and current circuit means, connected to said level comparator means and resistance circuit means, for supplying to said resistance circuit means a first current signal substantially free of variation caused by variation of the power source voltage, the first current signal providing a voltage drop corresponding to the first comparison level in said resistance circuit means after the output signal has been changed from the second output level to the first output level.

2. A comparator circuit according to claim 1, wherein said current circuit means supplies to said resistance circuit means a second current signal substantially free of variation caused by variation of the power source voltage, the second current signal causing a voltage drop corresponding to the second comparison level in said resistance circuit means after the output signal has been changed from the first output level to the second output level.

3. A comparator circuit according to claim 1, wherein said current circuit means includes constant current supplying means for supplying a constant current corresponding to the first current signal to said resistance circuit means after the output signal has been changed from the second output level to the first output level.

4. A comparator circuit according to claim 3, wherein the power source voltage is obtained from a positive power source circuit and a negative power source circuit; and said constant current supplying means includes:

a first N-channel transistor having a source connected to said negative power source circuit;

a first P-channel transistor having a source connected to said positive power source circuit and a gate connected to a drain of said first N-channel transistor;

a resistive element connected between the drain of said first N-channel transistor and a drain of said first P-channel transistor;

a second N-channel transistor having a source connected to said negative power source circuit and a gate and a drain both connected to the gate of said first N-channel transistor;

a second P-channel transistor having a source connected to said positive power source circuit, a drain connected to the drain of said second N-channel transistor, and a gate connected to the drain of said first P-channel transistor; and a third P-channel transistor having a source connected to said positive power source circuit, a gate connected to the drain of said first P-channel transistor and a drain to be supplied with the first current signal, and wherein said constant current supplying means is circuit-integrated with said level comparator means.

5. A comparator circuit according to claim 2, wherein said current circuit means includes constant current supplying means for supplying a constant current corresponding to the second current signal to said resistance circuit means after the output signal has been changed from the first output level to the second output level.

6. A comparator circuit according to claim 5, wherein the power source voltage is obtained from a positive power source circuit and a negative power source circuit; and said constant current supplying means includes:

a first P-channel transistor having a source connected to said positive power source circuit;

a first N-channel transistor having a source connected to said negative power source circuit and a gate connected to a drain of said first P-channel transistor;

a resistive element connected between the drain of said first P-channel transistor and a drain of said first N-channel transistor;

a second P-channel transistor having a source connected to said positive power source circuit and a gate and a drain both connected to the gate of said first P-channel transistor;

a second N-channel transistor having a source connected to said negative power source circuit, a drain connected to the drain of said second P-channel transistor, and a gate connected to the drain of said first N-channel transistor; and a third N-channel transistor having a source connected to said negative power source circuit, a gate connected to the drain of said first N-channel transistor and a drain to be supplied with the second current signal, and wherein said constant current supplying means is circuit-integrated with said level comparator means.

7. A comparator circuit according to claim 2, wherein said current circuit means includes:

a first constant current circuit for discharging the first current signal;

a second constant current circuit for absorbing the second current signal; and a switching circuit for causing the first current signal to be supplied to said resistance circuit means when the output signal is at the first output level and causing the second current signal to be extracted from said resistance circuit means when the output signal is at the second output level.

8. A comparator circuit according to claim 7, wherein said switching circuit includes a first switching transistor of a first conductivity type for making or breaking a circuit which supplies the first current signal to said resistance circuit means according to the signal level of the output signal, and a second switching transistor of a second conductivity type for making or breaking a circuit which supplies the second current signal to said resistance circuit means according to the signal level of the output signal, said first and second switching transistors being set in the ON state when said second and first switching transistors are set in the OFF state, respectively.

9. A comparator circuit according to claim 7, wherein said first constant current circuit includes a first current mirror circuit which receives a predetermined constant current and outputs the first current signal; and said second constant current circuit includes a second current mirror circuit which receives a predetermined constant current and outputs the second current signal.

10. A comparator circuit according to claim 9, wherein said first current mirror circuit includes a first transistor of a first conductivity type for outputting the first current signal from the drain thereof, and a second transistor of the first conductivity type having a drain in which the predetermined constant current flows and a gate connected to the gate of said first transistor, said second current mirror circuit includes a third transistor of a second conductivity type for outputting the second current signal from the drain thereof, and a fourth transistor of the second conductivity type having a drain in which the predetermined constant current flows and a gate connected to the gate of said third transistor, and said switching circuit includes a first switching transistor of the first conductivity type for making or breaking a circuit which is connected between said resistance circuit means and said first transistor and in which the first current signal flows according to the signal level of the output signal, and a second switching transistor of the second conductivity type for making or breaking a circuit which is connected between said resistance circuit means and said third transistor and in which the second current signal flows according to the signal level of the output signal, said first and second switching transistors being set in the ON state when said second and first switching transistors are set in the OFF state, respectively.

11. A comparator circuit according to claim 9, wherein said first current mirror circuit includes a first transistor of a first conductivity type for outputting the first current signal from the drain thereof, and a second transistor of the first conductivity type having a drain in which a current corresponding to the predetermined constant current flows, said second current mirror circuit includes a third transistor of a second conductivity type for outputting the second current signal from the drain thereof, and a fourth transistor of the second conductivity type having a drain in which a current corresponding to the predetermined constant current flows, and said switching circuit includes a fifth switching transistor of the first conductivity type for making or breaking a circuit between the gates of said first and second transistors according to the signal level of the output signal, a sixth transistor of the second conductivity type for making or breaking a circuit between the gates of said third and fourth transistors according to the signal level of the output signal, a seventh transistor of the first conductivity type having a drain-source path connected between the gate and source of said first transistor, and an eighth transistor of the second conductivity type having a drain-source path connected between the gate and source of said second transistor, said sixth transistor being set in the OFF state when said fifth and eighth transistors are set in the ON state, and said fifth transistor being set in the OFF state when said sixth and seventh transistors are set in the ON state.

12. A comparator circuit according to claim 1, wherein said current circuit means includes:
constant current means for supplying a predetermined constant current; and
circuit means for supplying the first current signal to said resistance circuit means when the output signal is at the first output level and supplying a composite current of the first current signal and the predetermined constant current to said resistance circuit means when the output signal is at the second output level.

13. A comparator circuit comprising:
level comparator means, coupled to a power source voltage and responsive to an input signal having a first input level higher than a predetermined first comparison level and to a second input level lower than a predetermined second comparison level, for generating an output signal which varies with level variation of the input signal between the first and second input levels, the output signal being varied from a first output level to a second output level when the level of the input signal is changed across the first comparison level, and being varied from the second output level to the first output level when the level of the input signal is changed across the second comparison level;
resistance circuit means, connected to said level comparator means, for providing a voltage drop corresponding to the first and second comparison levels; and
current circuit means, connected to said level comparator means and resistance circuit means, for supplying to said resistance circuit means a first current signal substantially free of variation caused by the variation of the power source voltage of said level comparator means, the first current signal providing a voltage drop corresponding to the second comparison level in said resistance circuit means after the output signal has been changed from the second output level to the first output level.

14. A comparator circuit according to claim 13, wherein said current circuit means supplies to said resistance circuit means a second current signal substantially free of variation caused by the variation of the power source voltage, the second current signal causing a voltage drop corresponding to the first comparison level in said resistance circuit means after the output signal has been changed from the first output level to the second output level.

15. A comparator circuit according to claim 13, wherein said current circuit means includes constant current supplying means for supplying a constant current corresponding to the first current signal to said resistance circuit means after the output signal has been changed from the second output level to the first output level.

16. A comparator circuit according to claim 15, wherein the power source voltage is obtained from a positive power source circuit and a negative power source circuit; and said constant current supplying means includes;
a first P-channel transistor having a source connected to said positive power source circuit;
a first N-channel transistor having a source connected to said negative power source circuit and a gate connected to a drain of said first P-channel transistor;
a resistive element connected between the drain of said first P-channel transistor and a drain of said first N-channel transistor;
a second P-channel transistor having a source connected to said positive power source circuit and a gate and a drain both connected to the gate of said first P-channel transistor;

a second N-channel transistor having a source connected to said negative power source circuit and a gate and a drain both connected to the drain of said second P-channel transistor; and a third N-channel transistor having a source connected to said negative power source circuit, a gate connected to the drain of said second N-channel transistor and a drain to be supplied with the first current signal, and wherein said constant current supplying means is circuit-integrated with said level comparator means.

17. A comparator circuit according to claim 14, wherein said current circuit means includes constant current supplying means for supplying a constant current corresponding to the second current signal to said resistance circuit means after the output signal has been changed from the first output level to the second output level.

18. A comparator circuit according to claim 17, wherein the power source voltage is obtained from a positive power source circuit and a negative power source circuit; and said constant current supplying means includes:
- a first N-channel transistor having a source connected to said negative power source circuit;
- a first P-channel transistor having a source connected to said positive power source circuit and a gate connected to a drain of said first N-channel transistor;
- a resistive element connected between the drain of said first N-channel transistor and a drain of said first P-channel transistor;
- a second N-channel transistor having a source connected to said negative power source circuit and a gate and a drain both connected to the gate of said first N-channel transistor;
- a second P-channel transistor having a source connected to said positive power source circuit and a gate and a drain both connected to the drain of said second N-channel transistor; and
- a third P-channel transistor having a source connected to said positive power source circuit and a gate and a drain both connected to the drain of said second N-channel transistor; and
- a third P-channel transistor having a source connected to said positive power source circuit, a gate connected to the drain of said second P-channel transistor and a drain to be supplied with the second current signal, and wherein said constant current supplying means is circuit-integrated with said level comparator means.

19. A voltage comparator circuit with hysteresis characteristics, comprising:
- voltage comparator means for comparing an input signal voltage with a comparison reference voltage and outputting a comparison result;
- a resistive element connected between a reference potential terminal and a comparison reference voltage input terminal of said voltage comparator means;
- first constant current source means for supplying current into the comparison reference voltage terminal, wherein said first constant current source means includes a first current mirror circuit having a first MOS transistor connected on the output side thereof, between said comparison reference voltage input terminal and a high potential side power source node;
- second constant current source means for deriving current out of the comparison reference voltage input terminal, wherein said second constant current source means includes a second current mirror circuit having a second MOS transistor connected on the output side thereof, between said comparison reference voltage input terminal and a low potential side power source node; and
- control means for selectively activating one of said first and second current source means, in accordance with the logic level of an output of the voltage comparator means.

20. A voltage comparator circuit according to claim 19, wherein said first and second current mirror circuits are connected to each other in a current mirror fashion.

21. A voltage comparator circuit according to claim 19, wherein said control means includes a third MOS transistor for switching, connected in series with said first MOS transistor between said comparison reference voltage input terminal and high potential side power source node, a fourth MOS transistor for switching, connected in series with said second MOS transistor, between said comparison reference voltage input terminal and low potential side power source node, and a control circuit for selectively setting said third and fourth MOS transistors in conduction states opposite to each other, in accordance with the logic level of an output of said voltage comparator circuit.

22. A voltage comparator circuit according to claim 19, wherein said control means includes a third MOS transistor for switching, connected in series with a connection line connecting together the gates of the MOS transistors which are connected in a current mirror fashion in said first current mirror circuit, a fourth MOS transistor for switching connected in series with a connection line connecting together the gates of the MOS transistors which are connected in a current mirror fashion in said second current mirror circuit, and a control circuit for selectively setting said third and fourth MOS transistors in conduction states opposite to each other, in accordance with the logic level of an output of said voltage comparator circuit.

23. A voltage comparator circuit with hysteresis characteristics, comprising:
- voltage comparator means for comparing an input signal voltage with a comparison reference voltage and outputting a comparison result;
- a resistive element connected between a reference potential terminal and a comparison reference voltage input terminal of said voltage comparator means;
- first constant current source means for supplying current into the comparison reference voltage terminal wherein said first constant current source means includes a first current mirror circuit having a first transistor connected on the output side thereof, between said comparison reference voltage input terminal and a high potential side power source node;
- second constant current source means for deriving current out of the comparison reference voltage input terminal, wherein said second constant current source means includes a second current mirror circuit having a second transistor connected on the output side thereof, between said comparison reference voltage input terminal and a low potential side power source node; and control means for selectively activating one of said first and second current source means, in accordance with the logic level of an output of the voltage comparator means.

24. A voltage comparator circuit according to claim 23, wherein said first and second current mirror circuits are connected to each other in a current mirror fashion.

25. A voltage comparator circuit according to claim 23, wherein said control means includes a third transistor for switching, connected in series with said first transistor between said comparison reference voltage input terminal and high potential side power source node, a fourth transistor for switching, connected in series with said second transistor, between said comparison reference voltage input terminal and low potential side power source node, and a control circuit for selectively setting said third and fourth transistors in conduction states opposite to each other, in accordance with the logic level of an output of said voltage comparator circuit.

26. A voltage comparator circuit according to claim 23, wherein said control means includes a third transistor for switching, connected in series with a connection line connecting together the gates of the transistors which are connected in a current mirror fashion in said first current mirror circuit, a fourth transistor for switching connected in series with a connection line connecting together the gates of the transistors which are connected in a current mirror fashion in said second current mirror circuit, and a control circuit for selectively setting said third and fourth transistors in conduction states opposite to each other, in accordance with the logic level of an output of said voltage comparator circuit.

* * * * *